(12) United States Patent
Benedetto

(10) Patent No.: US 6,650,003 B1
(45) Date of Patent: Nov. 18, 2003

(54) RADIATION SHIELDED CARRIERS FOR SENSITIVE ELECTRONICS

(75) Inventor: Joseph M. Benedetto, Monument, CO (US)

(73) Assignee: Aeroflex UTMC Microelectronic Systems, Inc., Colorado Springs, CO (US)

( * ) Notice: Subject to any disclaimer, the term of this patent is extended or adjusted under 35 U.S.C. 154(b) by 41 days.

(21) Appl. No.: 09/715,291

(22) Filed: Nov. 17, 2000

Related U.S. Application Data
(60) Provisional application No. 60/165,950, filed on Nov. 17, 1999.

(51) Int. Cl.$^7$ ............................................. H01L 23/552
(52) U.S. Cl. ........................ 257/659; 257/660; 257/703; 257/685
(58) Field of Search ............................ 257/703, 704, 257/678, 685, 659, 660

(56) References Cited

U.S. PATENT DOCUMENTS

| | | | |
|---|---|---|---|
| 5,406,117 A | 4/1995 | Dlugokecki et al. | 257/659 |
| 5,635,754 A | 6/1997 | Strobel et al. | 257/659 |
| 5,825,042 A | 10/1998 | Strobel et al. | 250/515.1 |
| 5,880,403 A * | 3/1999 | Czajkowski | 174/35 R |
| 5,889,316 A | 3/1999 | Strobel et al. | 257/659 |
| 5,998,867 A | 12/1999 | Jensen et al. | 257/729 |
| 6,261,508 B1 * | 7/2001 | Featherby et al. | 264/408 |
| 6,319,740 B1 * | 11/2001 | Heffner et al. | 438/26 |

* cited by examiner

Primary Examiner—Richard Elms
Assistant Examiner—Brad Smith
(74) Attorney, Agent, or Firm—Morgan & Finnegan, LLP

(57) ABSTRACT

A radiation shielding system for protecting an integrated circuit package from ionizing radiation is provided for an integrated circuit package which is substantially planar and has a plurality of package leads extending from at least one surface of the package, substantially perpendicular to a surface of the integrated circuit package. The system comprises a base portion comprising shielding material and defining a well for receiving the integrated circuit package. A lid of shielding material is provided for being attached to the base portion to completely encompass the integrated circuit package. The system also includes means for allowing portions of each of the package leads to exit the well when the integrated circuit package is within the well. The means includes insulating material.

10 Claims, 4 Drawing Sheets

RADIATION SHIELDED CARRIERS FOR SENSITIVE ELECTRONICS

This application claims the benefit of U.S. provisional patent application No. 60/165,950, filed on Nov. 17, 1999, which is incorporated by reference, herein.

FIELD OF THE INVENTION

The present invention relates to radiation shielded carriers for integrated circuit packages.

BACKGROUND OF THE INVENTION

Electrons trapped in high earth orbits and electrons and protons trapped in low and medium earth orbits cause a high level of ionizing radiation in space. Such ionizing radiation causes an accumulation of charge in electronic circuits which eventually results in a malfunction or failure of the circuits.

Shielding is commonly provided to protect radiation sensitive components. Currently, flat slabs of high-Z metal or layers of high-Z and low-Z metals are attached to either the top or top and bottom of electronics packages for shielding. The high Z metals, such as tungsten/copper alloys, absorb ionizing radiation, such as protons and electrons, and reemit the energy from such radiation in the more innocuous forms of light, some heat, and secondary electrons. Secondary electrons have a very short range and are mostly absorbed by high Z metals, as well. The low Z materials, such as aluminum, also absorb secondary electrons, and can improve the efficiency of the shield. However, such configurations do not protect sensitive electronics from radiation entering from the sides of the device, where no shielding material is present.

Shielding material is also used to encapsulate the integrated circuit die. Connections are provided within the shield from the integrated circuit die to package leads extending out of the shielding material. The shield encapsulating the integrated circuit die must be vertically sealed. See, example, U.S. Pat. No. 5,635,754. While usually providing better radiation protection, such devices are complex and expensive to manufacture.

Another method for protecting sensitive electronics is to design a radiation tolerant integrated circuit die that can withstand high levels of ionizing radiation. These design methodologies can involve redundancy of electronic circuits, suitable doping of the semiconductor material, and spacing of electronic circuits. These methodologies are not normally used in commercially available electronics and require increased cost for redesign and production.

SUMMARY OF THE INVENTION

According to the present invention, a radiation shielded carrier is provided for protecting an integrated circuit package from ionizing radiation, which completely encapsulates the integrated circuit package.

In one embodiment of the present invention, a radiation shielding system for protecting an integrated circuit package from ionizing radiation is provided for an integrated circuit package which is substantially planar and has a plurality of package leads extending from at least one surface of the package, substantially perpendicular to a surface of the integrated circuit package. The system comprises a base portion comprising shielding material and defining a well for receiving the integrated circuit package. A lid of shielding material is provided for being attached to the base portion to completely encompass the integrated circuit package. The system also includes means for allowing portions of each of the package leads to exit the well when the integrated circuit package is within the well. The means includes insulating material.

In another embodiment of the invention, a radiation shielded integrated circuit device comprises an integrated circuit package including an integrated circuit die electrically connected to a plurality of package leads. Shielding material completely encompasses the integrated circuit package. The shielding material defines a plurality of openings. The number of openings is at least equal to the number of leads of the integrated circuit package and the locations of the openings correspond to the locations of each of the package leads such that each package lead extends through a respective opening in the shielding material. Insulating material is provided in the openings.

In accordance with another embodiment of the invention, a radiation shielded integrated circuit device comprises an integrated circuit package including first and second substantially planar surfaces and two rows of package leads extending from opposing edges of the first surface, substantially parallel to the first surface. Each row extends in opposite directions. Shielding material is provided including first and second substantially planar surfaces opposing the first and second surfaces of the integrated circuit die, respectively. Four side walls of shielding material connect the first and second planar surfaces of shielding material. Insulating material is disposed along two opposing side walls of shielding material. The insulating material defines a plurality of openings corresponding to the number and location of the package leads. Each of the package leads extends through a respective opening.

BRIEF DESCRIPTION OF THE DRAWINGS

The present invention will be described with reference to the accompanying drawings, wherein.

DETAILED DESCRIPTION OF THE INVENTION

Figure 1A:
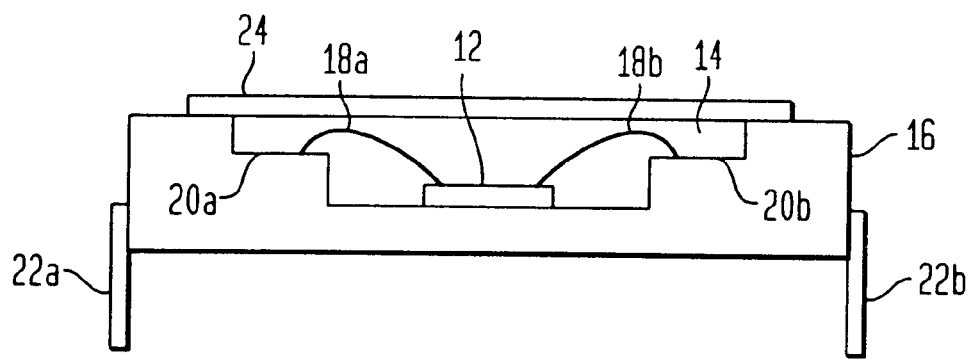
FIGS. 1a and 1b are cross-sectional views of integrated circuit ("IC") packages.

FIG. 1a is a cross-sectional view of a typical integrated circuit ("IC") package 10 which may be shielded in accordance with the present invention. An IC die 12, which includes the silicon substrate and the IC components providing the functionality of the circuit, is mounted in a well 14 of a ceramic base 16. Wire bands 18a, 18b connect the integrated circuit die 12 to wire band pads 20a, 20b, respectively. While only two wire bands 18a, 18b are shown in the cross-sectional view of FIG. 1, it is understood that a plurality of wire bands are typically provided. The wire band pads are electrically connected to package leads, such as package leads 22a, 22b, as is known in the art. A lid 24 is provided to hermetically seal the well 14 to protect the integrated circuit die 12. The lid may be a metal, such as Kovar, or a ceramic. Modem IC packages are typically rectangular.

Figure 1B:
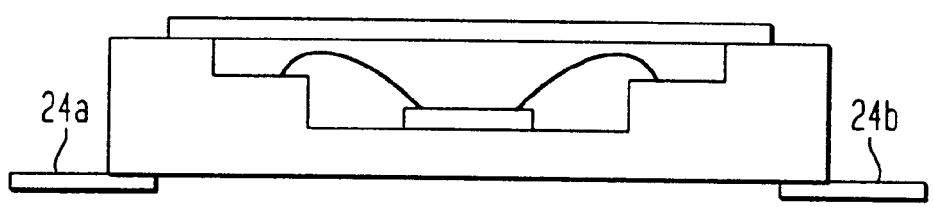

In the configuration of FIG. 1a, the package leads 22a, 22b extend downwardly from the side walls of the IC package 10, perpendicular to the bottom of the base of the IC package 10. FIG. 1b is a cross-sectional view of an IC package 24 which is identical to the IC package 10 of FIG. 1a, except that the package leads 24a, 24b extend outwardly from opposing edges of the bottom of the base of the IC package 24, substantially perpendicular to the side walls of the IC package 24. While only one pair of package leads 22a, 22b and 24a, 24b are shown in the views of FIGS. 1a and 1b, it is understood that a plurality of package leads parallel to the package leads shown, extend along the side walls or along the bottom of the IC packages 10 and 24, respectively. In addition, the package leads may be provided in an array of rows and columns extending through the bottom of the base of the IC package, perpendicular to the bottom of the base.

Figure 2:
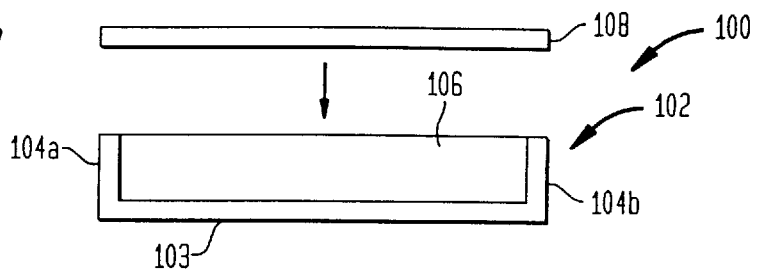
FIGS. 2–4 are cross-sectional views of a radiation shielded carrier.

FIG. 2 is a cross-sectional, side, disassembled view of two components of a radiation shielded carrier 100 for encompassing an IC package, such as IC package 10 in FIG. 1a, in accordance with one embodiment of the invention. A base 102 of shielding material includes a base wall 103 and a side wall 104 extending from the base wall 103, defining a well 106. The wall may comprise four walls 104a, 104b, 104c, 104d, substantially perpendicular to the base 102. Two of the side walls 104a, 104b are shown in FIG. 1.

Returning to FIG. 2, a lid 108 of shielding material is provided for attachment to the side walls 104a–104d of the base 12. The base 102 and lid 108 are typically rectangular. The shape and dimensions of the shielded carrier may vary based on environment where the shielded carrier will be mounted. The outer diameter of the base and the lid 108 are substantially the same, so that the lid 108 completely covers the well 106.

Figure 3:
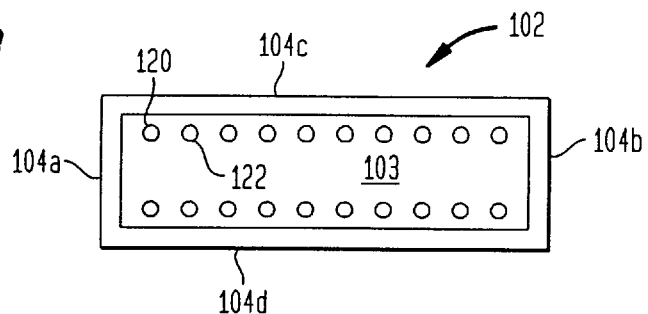

As shown in the cross-sectional view of FIG. 3, a plurality of holes 120 are defined through the base wall 103 for receiving the package leads 22a, 22b of the IC package 10 placed in the well 106. Each of the holes 120 have a diameter slightly larger than the diameter of the package leads. For example, where the pin diameter is about 20 millimeters, the hole diameter is preferably about 20.2 mm. Each hole is filled with insulation material 122 such as glass. Epoxies and plastics may be used, as well. In this case, the shielded carrier 100 is adapted to accommodate an integrated circuit package having two rows of 10 package leads extending from the side walls of the IC package, as in the IC package 10 of FIG. 1a. Other pin arrangements, such as array of 10 rows of 10 package leads each, can be readily accommodated, as well, by providing a suitable number of holes in suitable locations through the base wall 103 of the base 102.

To assemble the shielded carrier, the IC package 24 is placed in the well 106 of the base 102, so that the pins 126 extend through the holes 120. The lid 104 is then connected to the top of the four side walls 104a–104d of the base 102 by epoxy, solder, braze, welding, or a clamp. One edge of the lid and base may also be connected through a hinge to allow the lid to pivot into open and closed positions. A clip may be provided on the lid to engage the base in the closed position. The IC package 10 may be connected to the base by epoxy or solder, as well. The IC package 10 is completely surrounded by the shielded carrier 100, except for the portions of the package leads 22a, 22b extending through the carrier 100.

The package leads 22a, 22b are not themselves susceptible to ionizing radiation. The package leads 22a, 22b preferably substantially fill the holes 120. In addition, the insulation material 122 is somewhat radiation resistant. The amount of ionizing radiation which can enter the radiation shielded carriers of the present invention is therefore minimal. Since the IC die 12 is hermetically sealed in the IC package. 10, 10a, the radiation shielded carriers of the present invention need not be hermetically sealed.

Figure 5:
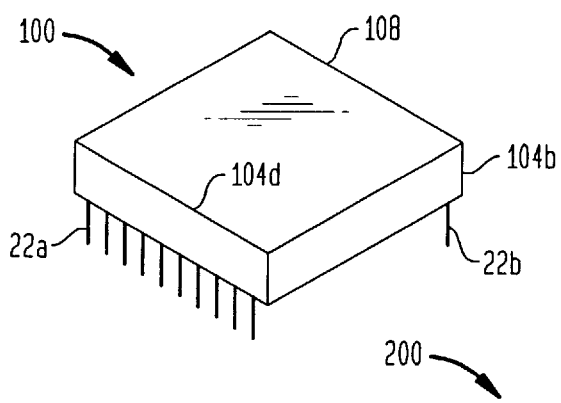
FIG. 5 is a top perspective view of an assembled radiation shielded carrier.

FIG. 5 is a top perspective view of an assembled radiation shielded carrier 100 containing an IC package 10a, showing a row of package leads 22a and one of the row of package leads 22b.

Figure 4:
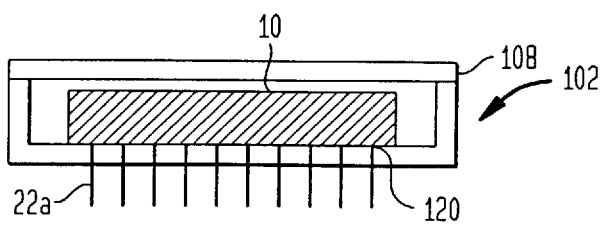

FIG. 4 is a cross-sectional view of an assembled shielded carrier, including an IC package 10 received in the well 106, showing a row of package leads 22a of the IC package 10 extending through the holes 120 and insulative material 122.

Figure 6:
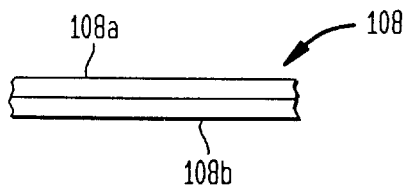
FIG. 6 is a portion of a lid including a layer of high Z material over low Z material.

The base 102 and lid 108 of the shielded carrier 100 are made of a high Z material, preferably a copper/tungsten alloy. An alloy of approximately 90% tungsten/10% copper, which has a density of about 18.31 g/cm$^3$, is preferred. Suitable alloys, in the desired shapes, may be obtained from NEC Corporation, Japan and Kyocera Corporation, Japan, for example. The shield may also be of a combination of an outer layer of a high Z material, such as the tungsten/copper alloy, and a low Z material, such as aluminum. FIG. 6 is a portion of a lid 108a including a layer of high Z material 108a over low Z material 108b. Such multiple layer material may also be provided by NEC Corporation and Kyocera Corporation. Kovar may be used, as well. Kovar is an inert metal alloy consisting of manganese, silicon, nickel and cobalt, with a density of about 8.36 g/cm$^3$.

The thickness of the walls of the base 102 and lid 108 is determined by the amount of shielding required in the ionizing environment. In high earth orbits, including geosynchronous orbit, 0.5 to 1.5 g/cm$^2$ of shielding material is sufficient. For low to medium earth orbits, 2 to 3 g/cm$^2$ of shielding material is required. These loading requirements translate to a 10% tungsten/90% cooper alloy thickness of about 0.026 to 0.078 cm for high earth orbits and about 0.10 to 0.16 cm for low to medium earth orbits. If Kovar is used, thicker shielding walls are required.

Figure 7:
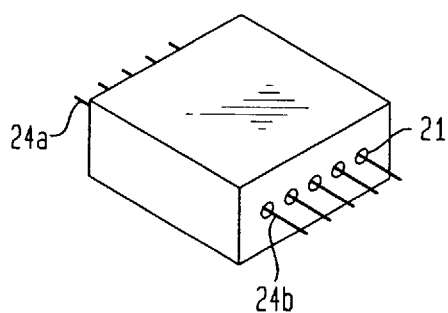
FIG. 7 is a perspective view of a radiation carrier shield.

FIG. 7 is a perspective view of a radiation carrier shield 200 of a second embodiment of the present invention, showing one row of package leads 24b and two of the row of package leads 24a extending out of the side walls of the radiation carrier shield 200.

Figure 8:
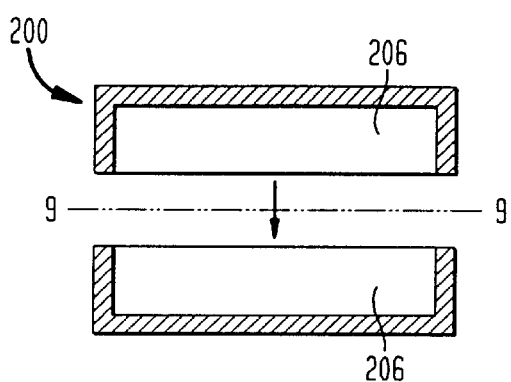
FIG. 8 is a cross-sectional, diassembled view of a radiation carrier shield.
Figure 9:
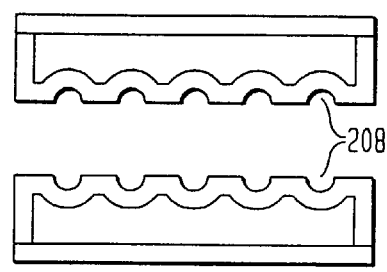
FIG. 9 is view of the upper and lower sections of a radiation carrier shield.

FIG. 8 is a cross-sectional, disassembled view of the second embodiment of the invention. The radiation shielded carrier 200 comprises a first section 202 and a second section 204, each defining a portion of a well 206, as shown in FIG. 9. FIG. 9 is view of the upper and lower sections of FIG. 5 along line 9—9 of FIG. 7. Matching semi-circular recesses 208 are provided in opposing walls of the first and second sections 202, 204, such that, when the first and second sections 202, 204 are mated, as in FIG. 7, circular openings 210 are formed. The semicircular recesses contain insulative material such as glass. The package leads 24a, 24b of the IC package 24 extend through the openings 210 when the radiation carrier shield 200 is assembled.

Figure 10:
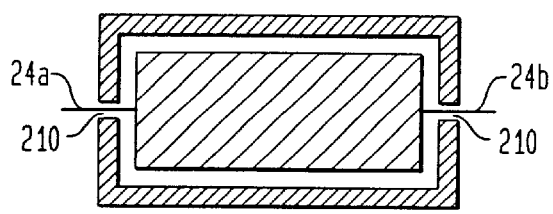
FIG. 10 is a cross-sectional view through one opening of a radiation shielded carrier.

FIG. 10 is a cross sectional view through one opening of the radiation shielded carrier 200 of FIG. 7, including the IC package 24. One pair of package leads 24a, 24b are shown extending through the openings 210. The internal details of the IC package 24 are not shown in this view.

As above, after placement of the IC package 24 into the position of the well 206 of one of the sections 202, 204, the first and second sections may be connected through epoxy, solder, braze or welding, screw, clamp, a hinge or a clip. Preferably, the IC package is attached to one of the sections through epoxy, solder or brace, as well.

Figure 11:
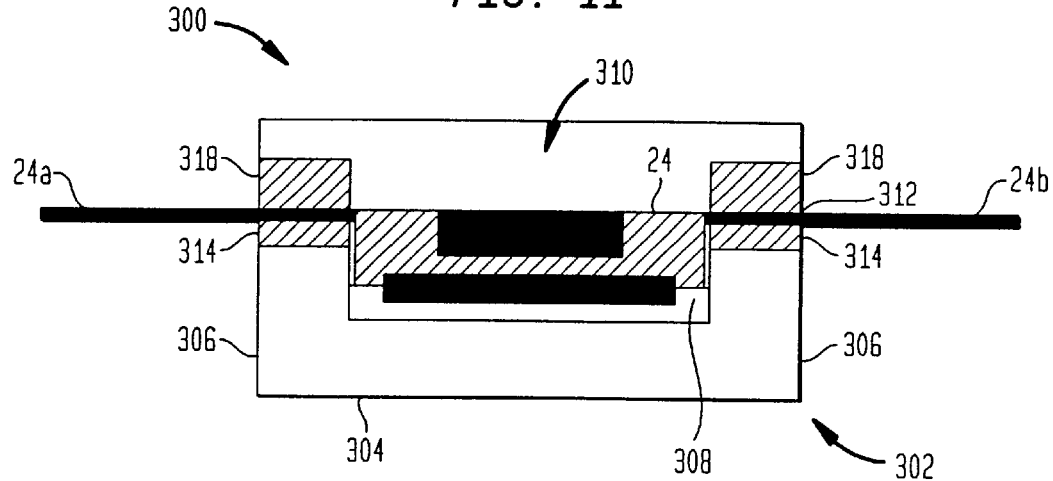
FIG. 11 is a cross-sectional view of a radiation shielded carrier.

FIG. 11 is a cross-sectional view of another radiation shielded carrier 300 for an IC package 24, as in FIG. 1a. A base 302 with a base wall 304 and a side wall 306 of shielding material defines a well 308 for receiving the IC package 24. Insulating material 314 extends along a portion of the side wall 306. A lid 310 covers the well 308. The package leads 24a, 24b extend through the side wall 306 of the radiation shielded carrier 300, through openings 312 in the insulating material. The openings 312 in the shielding material are shown in FIG. 13a.

Figure 12A:
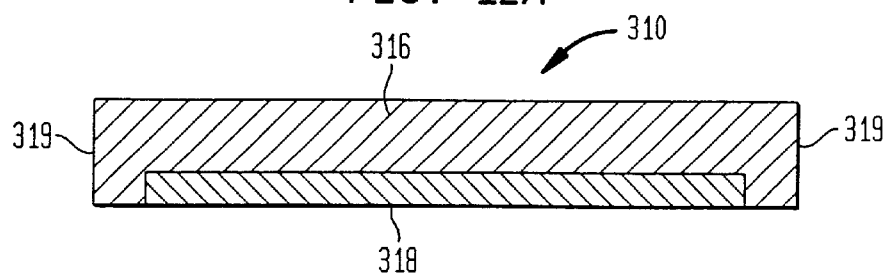
FIG. 12a is a side view of a lid.

FIG. 12a is a side view of the lid 310, showing shielding 316 material and a strip 318 of insulating material, such as glass. The strip 318 of insulating material is connected to the shielding material 316 by epoxy, or other glass adherence techniques known in the art. The insulating material 318 preferably extends between the wall portions 319 of shielding material.

Figure 12B:
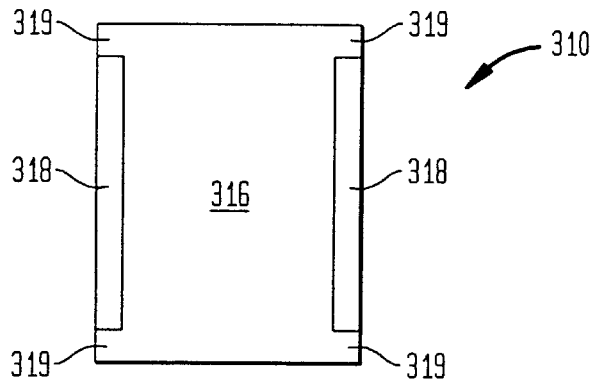
FIG. 12b is a bottom view of a lid.

FIG. 12b is a bottom view of the lid 316, showing the strips 318 of insulating material and the wall portions 319 of shielding material.

Figure 13A:
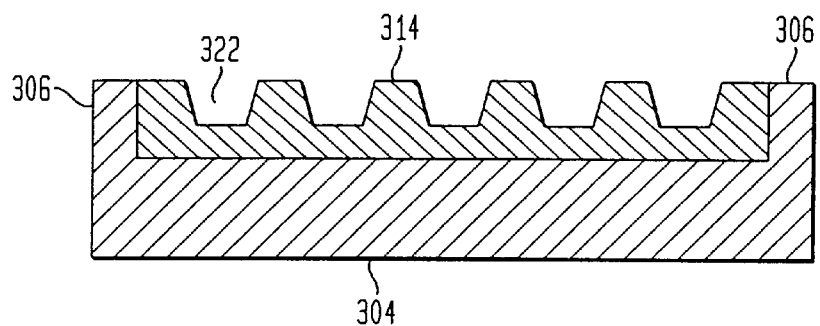
FIG. 13a is a side view of a base.

FIG. 13a is a side view of the base 302, showing the side walls 306 of shielding material and a strip of insulating material 314 in a sawtooth pattern including openings 322, between the side walls 306. The strip 314 of insulating material is also connected to the base wall 304 and side walls 306 by epoxy or other known glass adherence techniques. As with the lid 310, the strip of insulating material 314 on the base preferably extends between the walls 306 of shielding material.

To assemble the radiation shielded carrier 300, the IC package is placed in the well 308 such that the package leads 24a, 24b, extend through the recesses 322 in the insulation wall 320. The lid 310 is then attached to the top of the wall 305 and the insulating material 320.

Figure 13B:
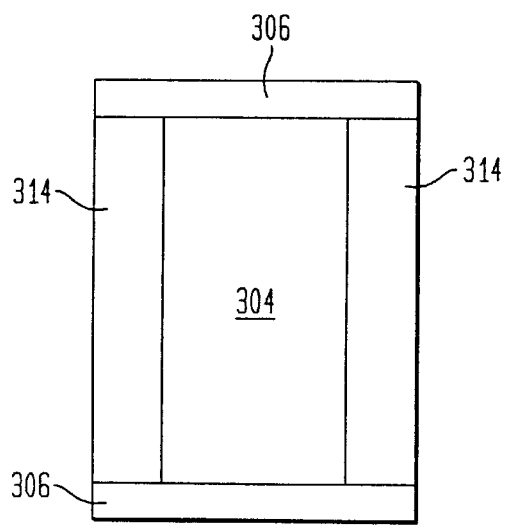
FIG. 13b is a top view of a base.

FIG. 13b is a top view of the base 304, showing the walls 314 of insulation and the tops of the walls 306. The sawtooth pattern of the insulation is not indicated in this view.

As in the embodiments above, since the package leads 24a, 24b substantially fill the recesses 322 and the insulation is somewhat radiation resistant, only a minimal amount of radiation may enter along the sides of the radiation shielded carrier 300. Also as above, the shielding material may be a single layer of high Z material, or a double layer of high Z material and low Z material. The copper tungsten alloy described above is the preferred high Z material.

The radiation shielded carrier of the present invention can be used with any plastic and ceramic standard IC packages.

Because the shielding material completely surrounds the IC package, the present invention is useful in applications where an anisotopic radiation environment, as well as an isotropic radiation environment exists.

It is understood that variations may be introduced to the embodiments discussed above without departing from the scope of the invention, which is defined in the claims below.

I claim:

1. A radiation shielding system for protecting an integrated circuit package from ionizing radiation, the integrated circuit package being substantially planar and having a plurality of package leads extending from at least one surface of the package, substantially perpendicular to a surface of the integrated circuit package, the system comprising:

a base portion comprising shielding material, the shielding material defining a well for receiving the integrated circuit package; and a lid of shielding material for being attached to the base portion to completely encompass the integrated circuit package; and means for allowing portions of each of the package leads to exit the well when the integrated circuit package is received in the well, said means including insulating material;

wherein the shielding material comprises an outer layer of high Z material and an inner layer of low Z material.

2. A radiation shielding system for protecting an integrated circuit package from ionizing radiation, the integrated circuit package being substantially planar and having a plurality of package leads extending from at least one surface of the package, substantially perpendicular to a surface of the integrated circuit package, the system comprising:

a base portion comprising shielding material, the shielding material defining a well for receiving the integrated circuit package; and a lid of shielding material for being attached to the base portion to completely encompass the integrated circuit package; and means for allowing portions of each of the package leads to exit the well when the integrated circuit package is received in the well, said means including insulating material;

wherein the exit means comprise strips of insulating material connected to opposing walls of the base, the insulating material defining recesses for receiving the package leads.

3. The radiation shielding system of claim 2, wherein the base further comprises a strip of insulating material connected to corresponding opposing walls of the lid, such that when the lid is connected to the base, the strips of insulating material contact each other.

4. A radiation shielding system for protecting an integrated circuit package from ionizing radiation, the integrated circuit package being substantially planar and having a plurality of package leads extending from at least one surface of the package, substantially perpendicular to a surface of the integrated circuit package, the system comprising:

a base portion comprising shielding material, the shielding material defining a well for receiving the integrated circuit package; and a lid of shielding material for being attached to the base portion to completely encompass the integrated circuit package; and means for allowing portions of each of the package leads to exit the well when the integrated circuit package is received in the well, said means including insulating material;

wherein the lid and the base define corresponding semi-circular openings filled with insulating material, the semi-circular openings forming circular openings when the lid and base are connected.

5. A radiation shielded integrated circuit device comprising:

an integrated circuit package including an integrated circuit die electrically connected to a plurality of package leads;

shielding material completely encompassing the integrated circuit package, the shielding material defining a plurality of openings, the number of openings at least being equal to the number of leads of the integrated circuit package and the locations of the openings corresponding to the locations of the leads such that each of the leads extends through a respective opening in the shielding material; and insulating material in said openings;

wherein the integrated circuit package comprises a ceramic base defining a well for supporting the integrated circuit die and a metal lid for hermetically sealing the well, the base having a substantially planar portion defining in part the well;

wherein the shielding material comprises a first, substantially planar surface opposing the lid and a second, substantially planar surface opposing the planar portion of the base, and a connecting portion substantially perpendicular to the first and second opposing surfaces, connecting the first and second surfaces to each other;

wherein the integrated circuit package has side walls, the package leads of the integrated circuit package extend from the side walls, substantially perpendicular to the planar surface of the integrated circuit package, and the openings in the shielding material are defined in the second planar surface of the base.

6. A radiation shielded integrated circuit device comprising:

an integrated circuit package including an integrated circuit die electrically connected to a plurality of package leads;

shielding material completely encompassing the integrated circuit package, the shielding material defining a plurality of openings, the number of openings at least being equal to the number of leads of the integrated circuit package and the locations of the openings corresponding to the locations of the leads such that each of the leads extends through a respective opening in the shielding material; and insulating material in said openings;

wherein the integrated circuit package comprises a ceramic base defining a well for supporting the integrated circuit die and a metal lid for hermetically sealing the well, the base having a substantially planar portion defining in part the well;

wherein the shielding material comprises a first, substantially planar surface opposing the lid and a second, substantially planar surface opposing the planar portion of the base, and a connecting portion substantially perpendicular to the first and second opposing surfaces, connecting the first and second surfaces to each other;

wherein the package leads of the integrated circuit package extend from the planar surface of the base of the integrated circuit package, substantially parallel to the base of the integrated circuit package, and the openings in the shielding material are defined in opposing portions of the connecting portion of the shielding material.

7. A radiation shielded integrated circuit device comprising:

an integrated circuit package including an integrated circuit die electrically connected to a plurality of package leads;

shielding material completely encompassing the integrated circuit package, the shielding material defining a plurality of openings, the number of openings at least being equal to the number of leads of the integrated circuit package and the locations of the openings corresponding to the locations of the leads such that each of the leads extends through a respective opening in the shielding material; and insulating material in said openings;

wherein the integrated circuit package comprises a ceramic base defining a well for supporting the integrated circuit die and a metal lid for hermetically sealing the well, the base having a substantially planar portion defining in part the well;

wherein the shielding material comprises a first, substantially planar surface opposing the lid and a second, substantially planar surface opposing the planar portion of the base, and a connecting portion substantially perpendicular to the first and second opposing surfaces, connecting the first and second surfaces to each other;

wherein the package leads of the integrated circuit package extend through the planar surface of the integrated circuit package, substantially perpendicular to the planar surface, and the openings in the shielding material are defined in the second planar surface.

8. A radiation shielded integrated circuit device comprising:

an integrated circuit package including an integrated circuit die electrically connected to a plurality of package leads;

shielding material completely encompassing the integrated circuit package, the shielding material defining a plurality of openings, the number of openings at least being equal to the number of leads of the integrated circuit package and the locations of the openings corresponding to the locations of the leads such that each of the leads extends through a respective opening in the shielding material; and insulating material in said openings;

wherein the shielding material comprises a high Z material;

wherein the shielding material comprises an outer layer of high Z material and an inner layer of low Z material.

9. A radiation shielded integrated circuit device comprising:

an integrated circuit package including an integrated circuit die electrically connected to a plurality of package leads;

shielding material completely encompassing the integrated circuit package, the shielding material defining a plurality of openings, the number of openings at least being equal to the number of leads of the integrated circuit package and the locations of the openings corresponding to the locations of the leads such that each of the leads extends through a respective opening in the shielding material; and insulating material in said openings;

wherein the lid and the base define corresponding semi-circular openings filled with insulating material, the semi-circular openings forming circular openings when the lid and base are connected.

10. A radiation shielded integrated circuit device comprising:

an integrated circuit package including first and second substantially planar surfaces and two rows of package leads extending from opposite edges of the first surface, substantially parallel to the first surface, each row extending in opposite directions;

shielding material including first and second substantially planar surfaces opposing the first and second surfaces of the integrated circuit package, respectively, four side walls of shielding material connecting the first and second planar surfaces of shielding material; and insulating material disposed along two opposing side walls, the insulating material defining a plurality of openings corresponding to the number and location of the package leads, each of the package leads extending through a respective opening;

wherein the shielding material comprises a high Z material;

wherein the shielding material comprises an outer layer of high Z material and an inner layer of low Z material.

* * * * *